United States Patent [19]
Oh et al.

[11] Patent Number: 6,110,286
[45] Date of Patent: Aug. 29, 2000

[54] VERTICAL PROCESSING UNIT

[75] Inventors: Seungho Oh, Richardson, Tex.; Katsutoshi Ishii, Sagamihara, Japan; Toshiharu Nishimura, Kofu, Japan; Yutaka Takahashi, Hanamaki, Japan

[73] Assignee: Tokyo Electron Limited, Tokyo-To, Japan

[21] Appl. No.: 09/175,433

[22] Filed: Oct. 20, 1998

[30] Foreign Application Priority Data

Oct. 28, 1997 [JP] Japan ..................................... 9-311213

[51] Int. Cl.$^7$ ..................................................... C23C 16/00
[52] U.S. Cl. .......................... 118/715; 118/728; 118/729; 118/500; 156/349; 156/381
[58] Field of Search .................... 118/715, 500, 118/729, 728; 156/381, 349

[56] References Cited

U.S. PATENT DOCUMENTS

| | | | |
|---|---|---|---|
| 4,579,080 | 4/1986 | Martin et al. .............................. | 118/500 |
| 5,779,797 | 7/1998 | Kitano ...................................... | 118/500 |
| 5,985,033 | 11/1999 | Yudovsky et al. ........................ | 118/715 |
| 6,030,457 | 2/2000 | Shimazu et al. .......................... | 118/715 |

FOREIGN PATENT DOCUMENTS 7-130672  5/1995  Japan .

*Primary Examiner*—Deborah Jones
*Assistant Examiner*—Lymarie Miranda
*Attorney, Agent, or Firm*—Smith, Gambrell & Russell, LLP

[57] ABSTRACT

A vertical processing unit 10 for semiconductor wafers has; a cylindrical processing chamber 2 having an opening 18 in an inside of an annular bottom surface, and a disk-shaped cap 6 having an annular abutting-surface 32 abutting on the annular bottom surface of the chamber. A mounting-surface 6p formed on the inside of the annular abutting-surface 32. A wafer-boat 8 for holding a wafer W to be processed is mounted on the mounting-surface 6p of the cap 6. The abutting-surface 32 has an annular groove 34A formed therein. An inert gas supply passgeway 38 is provided in communication with the annular groove 34A for supplying an inert gas into the annular groove 34A through a header 16. An ejection opening 36 for ejecting an inert gas is provided on the inner side of the annular groove 34A for communicating the annular groove 34A and the interior of the processing chamber 2. Owing to the active leaking of the nitrogen ($N_2$) gas into the interior of the processing chamber 2 through the ejection opening 36, the corrosive gas as a processing gas in the processing chamber 2 does not leak out, so that corrosion or rusting of the equipment around the processing chamber 2 is prevented.

18 Claims, 9 Drawing Sheets

HCl LEAKAGE-CHECK

| RECIPE | run No. | SMELL | LITMUS | DETECTOR(ppm) |
|---|---|---|---|---|
| 900°C DRY-HCl | 1 | ODORLESS | NO CHANGE | 0.00 |
|  | 2 | ODORLESS | NO CHANGE | 0.00 |
|  | 3 | ODORLESS | NO CHANGE | 0.00 |
| 900°C DRY-HCl | 4 | ODORLESS | NO CHANGE | 0.00 |
|  | 5 | ODORLESS | NO CHANGE | 0.00 |
| 750°C WET-HCl | 6 | ODORLESS | NO CHANGE | 0.00 |
|  | 7 | ODORLESS | NO CHANGE | 0.00 |
|  | 8 | ODORLESS | NO CHANGE | 0.00 |
| 850°C WET-HCl | 9 | ODORLESS | NO CHANGE | 0.00 |
| 800°C WET-HCl | 10 | ODORLESS | NO CHANGE | 0.00 |

FIG.7

UNIFORMITY OF THE THICKNESS OF OXIDE FILM

| RECIPE | RUN No. | W IN W (±%) | W TO W (±%) | OVERALL (±%) | R TO R (±%) |
|---|---|---|---|---|---|
| 900°C DRY-HCl | 1 | 2.20 | 1.01 | 2.83 | |
| | 2 | 2.37 | 1.28 | 3.51 | 1.17 |
| | 3 | 2.36 | 0.90 | 3.02 | |
| 900°C DRY-HCl | 4 | 2.40 | 1.00 | 3.19 | 0.64 |
| | 5 | 2.38 | 2.12 | 4.19 | |
| 900°C WET-HCl | 6 | 3.09 | 0.81 | 3.31 | |
| | 7 | 2.30 | 0.74 | 2.96 | 0.29 |
| | 8 | 2.51 | 0.72 | 3.29 | |
| 850°C WET-HCl | 9 | 1.39 | 0.72 | 1.53 | / |
| 800°C WET-HCl | 10 | 1.73 | 1.35 | 2.87 | / |

FIG. 9

VERTICAL PROCESSING UNIT

FIELD OF THE INVENTION

This invention concerns a vertical processing unit having a cap, in particular, a vertical processing unit having a cap with an improved sealing structure.

BACKGROUND OF THE INVENTION

Semiconductor wafers generally undergo several processes, such as a film forming, an oxidation processing and a diffusion processing, during the manufacturing of semiconductor integrated circuits. Vertical processing units are often used for processing, as they can process many wafers at a time.

Vertical processing units comprise a cylindrical processing chamber with a ceiling. The chamber has an opening inside of the bottom surface, through which multiple semiconductor wafers held by a wafer-boat are loaded into the processing chamber. The processing chamber is then tightly closed, and the wafers undergo processing, e.g. are heated, exposed to certain gases and then subjected to a further heating.

The atmosphere in the processing chamber may be at a vacuum or at substantially the atmospheric pressure, depending on the type of process to be conducted. A variety of gases are also used for processing. If the processing pressure in the processing chamber is reduced, the processing gas in the chamber seldom leaks out of the chamber because the gas is sucked out with a vacuum pump. On the other hand, when the processing pressure in the processing chamber is maintained near the atmospheric pressure, the processing gas may leak out of the chamber because the gas in the chamber is not sucked out so strongly. In order to prevent this, a reliable sealing structure has to be provided.

In particular, when the processing pressure is at substantially the atmospheric pressure and the processing gas comprises a corrosive gas such as hydrochloric acid (HCl), for example in the oxidation process, the sealing structure for the processing chamber has to be highly sophisticated.

The sealing structure in a conventional processing unit is as follows. FIG. 11 is a schematic view of a conventional vertical processing unit. FIG. 12 is a plan view of a cap in the processing unlit shown in FIG. 11. FIG. 13 is an enlarged partial view of a sealing structure between the bottom surface of the processing chamber and the cap.

As shown in FIG. 11, the processing chamber 2 made of quartz is a cylinder with the top end closed by a ceiling and the bottom end left open. A flange 4 for connecting with the cap 6 is formed around the bottom circumference of the cylinder.

The bottom of the processing chamber 2 is sealed by the disk-shaped cap 6 (see FIG. 12) made of quartz, which can be moved vertically by an elevating mechanism (not shown). In FIG. 11, the cap 6 is positioned a short distance below the bottom of the processing chamber 2. A quartz wafer-boat 8 is mounted on a thermal tube 10, which is mounted on the cap 6. The wafer-boat holds wafers W in a number of stages, each spaced at a specific pitch. The wafer-boat 8 can be loaded into and unloaded from the processing chamber 2 by raising and lowering the cap 6.

An abutting-surface 12 on the bottom surface of the flange 4 tightly connects with an abutting-surface 14 of the cap 6 when the wafers are loaded into the processing chamber 2. The abutting-surface 14 forms an annular protrusion which protrudes above the upper surface of the cap 6. As shown in FIG. 13, a header 16 for supplying an inert gas runs along an intermediate portion of the abutting-surface 12 of the flange 4. The header 16 has a concave section. An inert gas such as nitrogen ($N_2$) gas is supplied into the header 16 at a certain pressure, so that the processing gas (the environmental gas) in the processing chamber 2 is prevented from leaking out. This is effective even when the plane contact (plane abutting) between both the abutting-surfaces 12, 14 is not uniform.

In the above described structure, both the abutting-surface 12 on the flange 4 of the processing chamber 2 and the abutting-surface 14 of the cap 6 have to be manufactured with a high degree of precision for achieving a highly sophisticated sealing. It is difficult to form a flat surface of quartz over an annular plane area with a high precision because quartz has a very poor workability. Thus, any imperfections in the annular abutting-surfaces 12, 14 result in a less-than-perfect seal. If this happens, the processing gas (e.g. corrosive gas) in the processing chamber 2 may leak out of the processing chamber 2, even if nitrogen ($N_2$) gas is supplied into the header 16 to bring the interface between both the abutting-surfaces 12, 14 at a positive pressure.

Even if both of the abutting-surfaces 12, 14 are manufactured with a high precision, slight discrepancies in the assembly process may lead to the less-than-perfect contact and result in the processing gas leaking out of the processing chamber. In addition, it takes a long time to manufacture broad abutting-surfaces such as those in 12 and 14 with a high degree of precision.

To solve the above problems, a large amount of compressed inert gas could be pumped into the processing chamber. But this would also increase the amount of inert gas, so that the processes on the wafers may be unevenly conducted among the wafers or over each surface of each wafer.

SUMMARY OF THE INVENTION

The object of this invention is to solve the above problems, that is, to provide a vertical processing unit which can surely prevent the processing gas from leaking out of the processing chamber.

A vertical processing unit according to the invention comprises; a cylindrical processing chamber having an annular bottom surface and an opening in an inside of the annular bottom surface, a disk-shaped cap having an annular abutting-surface abutting on the annular bottom surface of the chamber and a mounting-surface formed on an inside of the annular abutting-surface, and holding means for holding an object to be processed, mounted on the mounting-surface of the cap, wherein the abutting-surface has an annular groove formed therein, an inert gas supply passageway is provided in communicating with the annular groove for supplying an inert gas into the annular groove, and an ejection opening for ejecting an inert gas is provided on an inner side of the annular groove for communicating the annular groove and an interior of the processing chamber.

The ejection opening may be formed annularly along an inner side of the annular groove in the abutting-surface of the cap. In that case, the ejection opening may be formed by removing around the inner side of the annular groove in the abutting-surface of the cap.

On the other hand, plural ejection openings may be formed at intervals in the inner side of the annular groove in the abutting-surface of the cap. In that case, the plural ejection openings may be formed at regular intervals in the inner side of the annular groove in abutting-surface of the cap.

Plural inert gas supplying passageways are preferably arranged at positions corresponding to the plural ejection openings.

Another vertical processing unit according to the invention comprises; a processing cylindrical chamber having an annular bottom surface and an opening in an inside of the annular bottom surface, a disk-shaped cap having an annular abutting-surface corresponding to the annular bottom surface of the chamber and a mounting-surface formed on an inside of the annular abutting-surface, and holding means for holding an object to be processed, mounted on the mounting surface of the cap, wherein the annular bottom surface has an annular groove formed therein, an inert gas supplying passageway is provided in communicating with the annular groove for supplying an inert gas into the annular groove, and an ejection opening for ejecting an inert gas is provided on an inner side of the annular groove for communicating the annular groove and an interior of the processing chamber.

The ejection opening may be formed annularly along the inner side of the annular bottom surface of the processing chamber. In that case, the ejection opening may be formed by removing a portion of the inner side of the annular bottom surface of the processing chamber.

On the other hand, plural ejection openings may be formed at intervals in the annular bottom surface of the processing chamber. In that case, plural ejection openings may be formed at regular intervals in the annular bottom surface of the processing chamber. Plural inert gas supplying passageways are preferably arranged at positions corresponding to the plural ejection openings.

BRIEF DESCRIPTION OF THE DRAWINGS

FIG. 7 is a table showing results of a leak-check for the HCl gas;

FIG. 9 is a graph of the evenness on the thickness of the oxide film;

BEST MODE FOR CARRYING OUT THE INVENTION

The embodiments of this invention will now be described in detail with reference to drawings. They are vertical processing units used for an oxidation process or a diffusion process.

Figure 1:
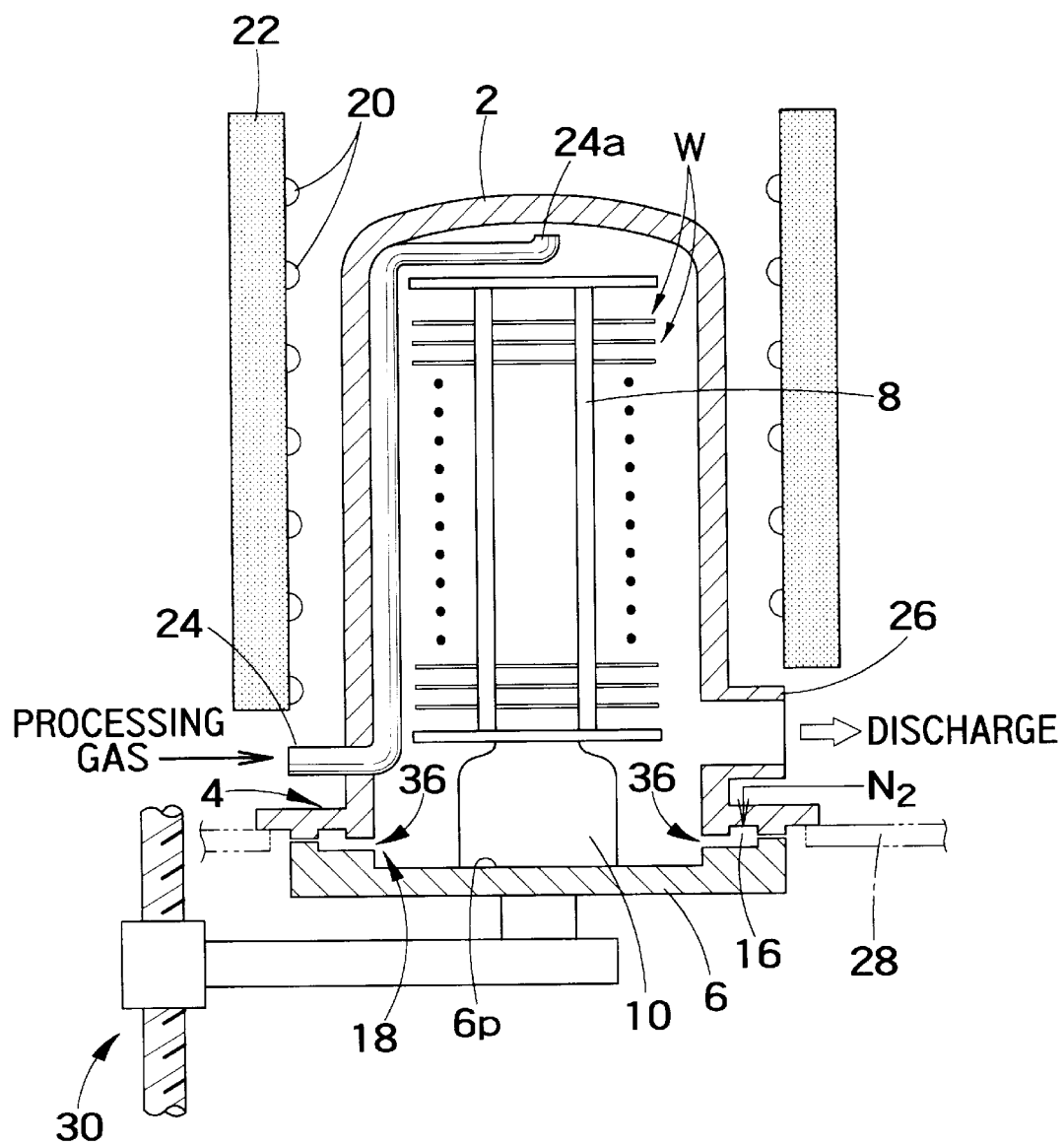
FIG. 1 is a schematic view of the vertical processing unit according to an embodiment of the invention.
Figure 2:
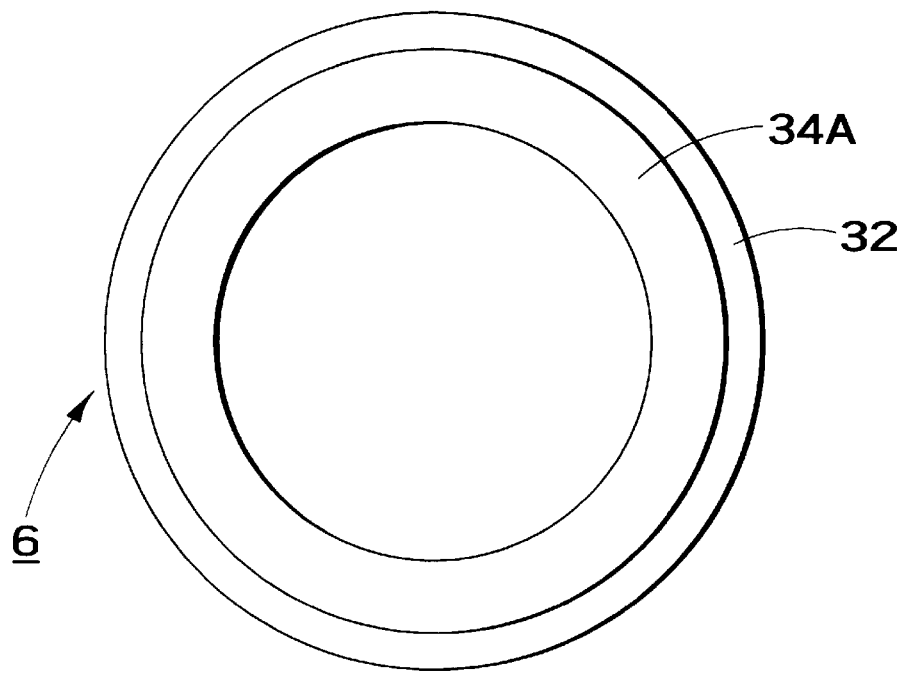
FIG. 2 is a plan view of the cap in FIG. 1.
Figure 3:
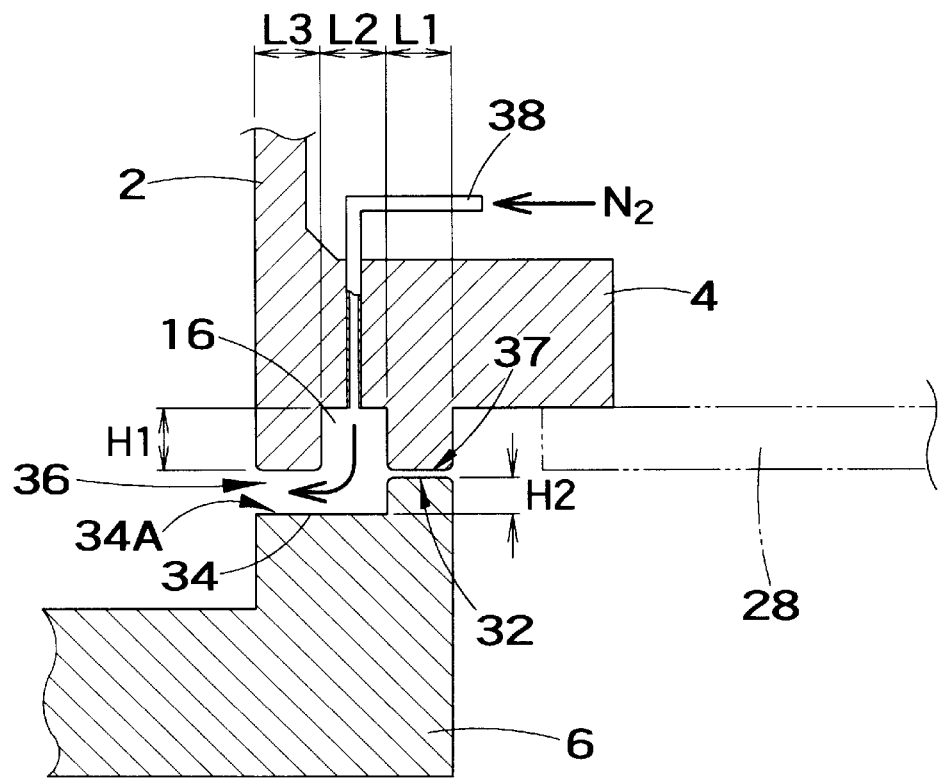
FIG. 3 is a fragmentary enlarged view in vertical section of abutting surfaces of a processing chamber and the cap in FIG. 1 when the processing chamber abuts on the cap.
Figure 4:
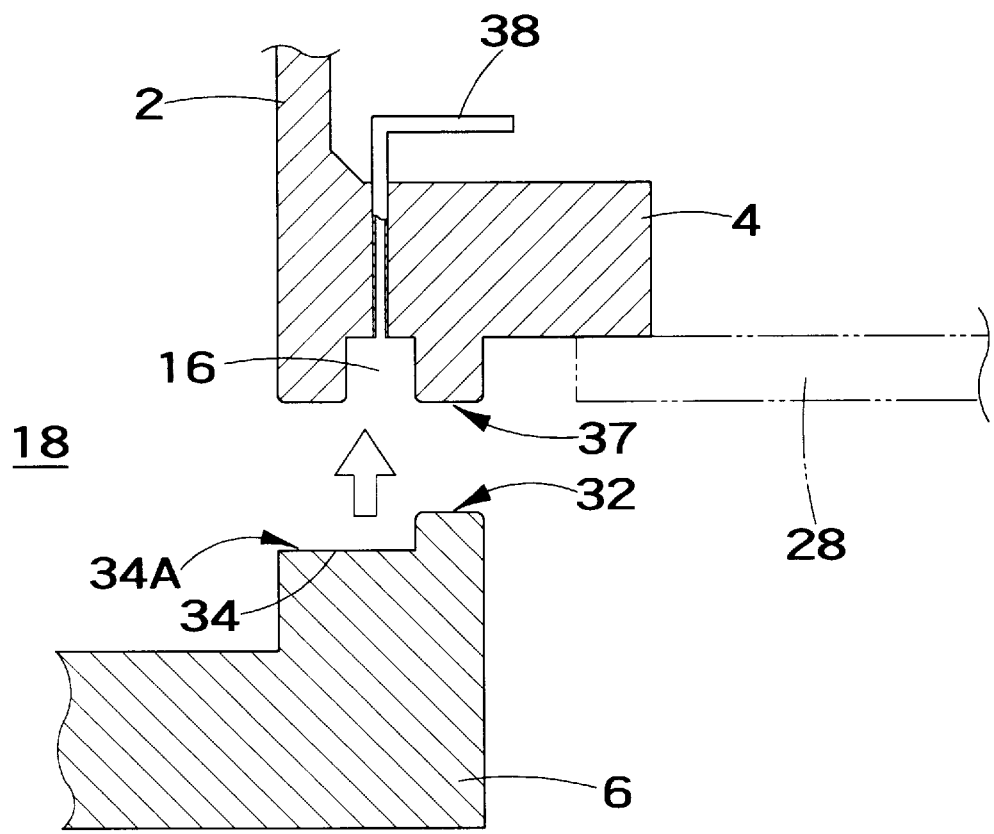
FIG. 4 is a fragmentary enlarged view of abutting surfaces of the processing chamber and the cap in FIG. 1 when the processing chamber is away from the cap.
Figure 5:
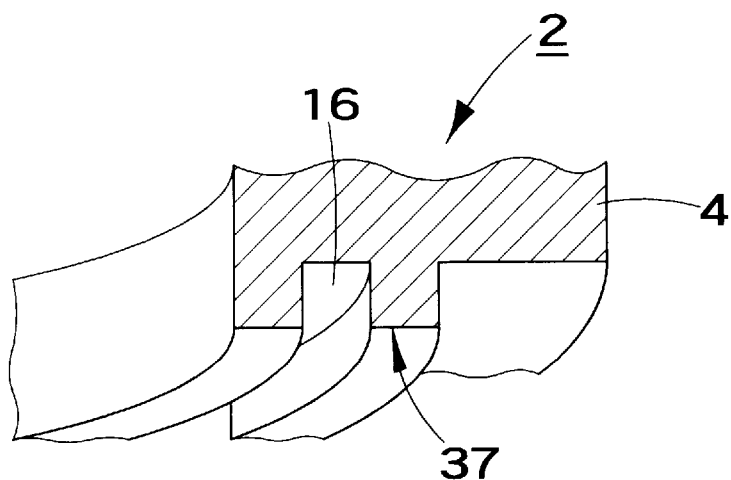
FIG. 5 is a fragmentary enlarged view of the bottom surface of the processing chamber.
Figure 6:
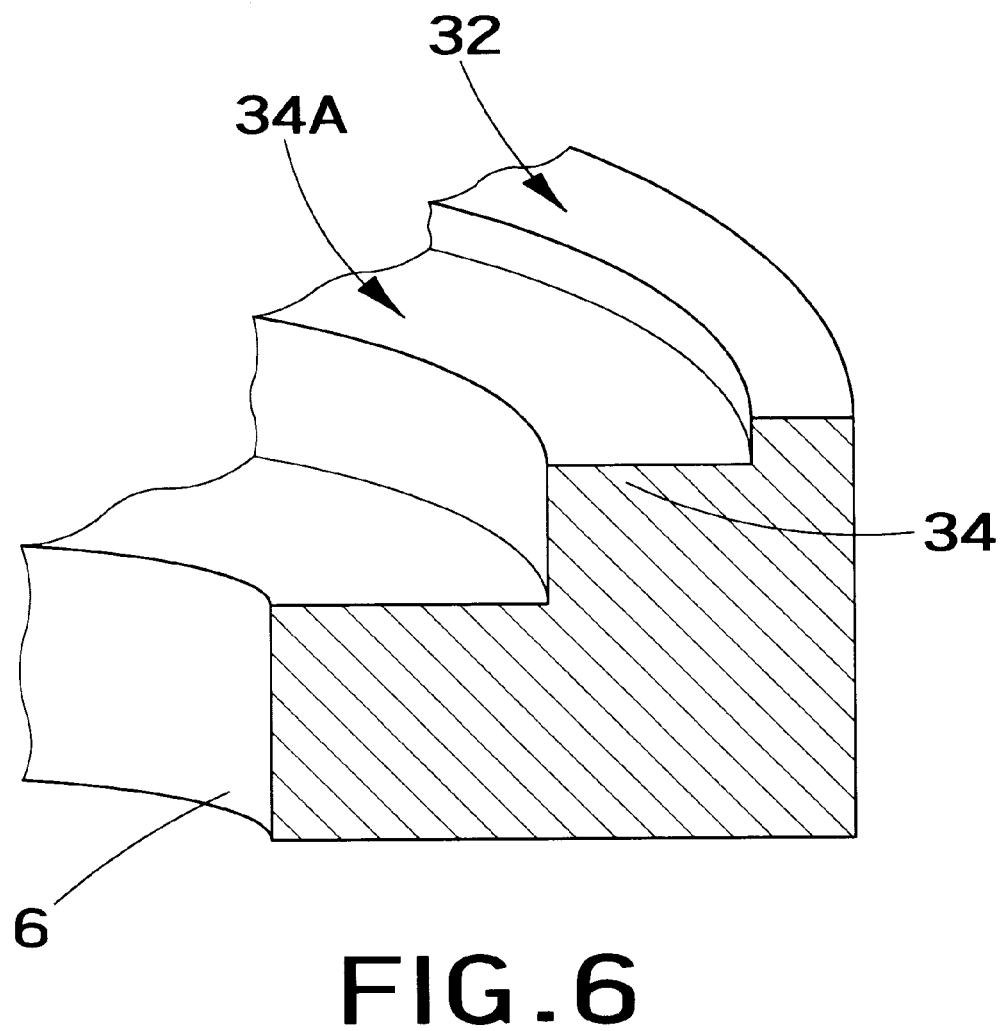
FIG. 6 is a fragmentary enlarged view of the peripheral part of the cap.

FIG. 1 is a schematic view of the vertical processing unit according to an embodiment of the invention. FIG. 2 is a plan view of a cap shown in FIG. 1. FIG. 3 and FIG. 4 are fragmentary enlarged views showing abutting-surfaces of a processing chamber and the cap in FIG. 1. FIG. 5 is a fragmentary enlarged view of the bottom of the processing chamber. FIG. 6 is a fragmentary enlarged view of the peripheral pat of the cap.

As shown in FIG. 1, a processing chamber 2 made of quartz is in the form of a cylinder with a closed top end or ceiling. The processing chamber 2 has an opening 18 at the bottom. An abutting flange 4 is formed around the bottom circumference of the cylinder 2. This processing chamber 2 is covered by a cylindrical thermal insulation 22, in which heaters 20 are arranged to form a heating furnace.

A gas introducing nozzle pipe 24 is provided through the lower side wall of the processing chamber 2 for introducing a processing gas. The nozzle pipe 24 extends upward to the ceiling along the side wall of the processing chamber 2 and terminates in a nozzle 24a. A processing gas discharge port 26 having a relatively large diameter is also provided through the lower side wall of the processing chamber 2 for discharging a processing gas. The discharge port 26 is connected with a discharging system (not shown) having a discharging pump.

The outermost periphery of the flange 4 of the processing chamber 2 is supported by, for example, a base plate 28 made of stainless steel for holding the entire processing chamber 2.

The opening 18 in the bottom of the processing chamber 2 can be opened and sealed by a cap 6 made of quartz, which can be moved vertically by an elevating mechanism 30 such as a boat-elevator. A wafer-boat 8 made of quartz holds wafers W in a number of stages at regular pitches to hold objects to be processed. The wafer-boat 8 is mounted on a thermal tube 10, which is mounted on the mounting-surface 6p of the cap 6. The wafer-boat 8 and the thermal tube 10 form a holding means for holding an object to be processed. The wafer-boat 8 can be loaded into and unloaded from the processing chamber 2 by raising and lowering the cap 6.

As shown in FIG. 2, the cap 6 is shaped like a disk. The outermost periphery of the cap 6 is formed as an annular abutting-surface 32, which can directly abut the flange 4 of the processing chamber 2. As shown in FIG. 3 and FIG. 4, an annular lowered step 34 is formed along and inside of the abutting-surface 32 by removing an appropriate thickness (see FIG. 6). An upper surface 34A of the annular step 34 forms an annular groove in the abutting-surface 32. The annular step 34 can provide an ejection opening 36 for ejecting therethrough an inert gas as described below. FIG. 4 shows a status in which the cap 6 is moved slightly away from the bottom of the processing chamber 2.

An annular abutting-surface 37 (annular bottom surface) is formed on the bottom surface of the flange 4 of the processing chamber 2, in a region corresponding to the abutting-surface 32 of the cap 6. The outer periphery of the abutting-surface 37 is formed stepwise by removing an appropriate thickness, to be supported by a base-plate 28.

An annular header 16 for supplying an inert gas therethrough runs along and inside of the abutting-surface 37 as an annular groove with a concave section (see FIG. 5 ). The header 16 is communicated with an inert gas supply passageway 38 to supply an inert gas such as $N_2$ gas at an appropriate pressure. Thus, as shown in FIG. 3, the annular ejection opening 36 is provided between the innermost portion of the bottom of the flange 4 and the upper surface 34A of the step 34 of the cap 6 when the opening 18 in the bottom of the processing chamber 2 is tightly sealed with the cap 6. Because of this, the $N_2$ gas supplied into the header 16 is substantially uniformly supplied into the processing chamber 2 from the bottom circumference thereof via the annular ejection opening 36.

Regarding the dimension of this unit, reference is made to FIG. 3. The inside diameter of the pressing chamber 2 is about 250 mm if the unit is used for 8 inch semiconductor wafers W. The width L1 of the abutting-surface 37 of the flange 4 is about 6 mm, the width L2 of the header 16 is about 7 mm and the width L3 of the portion inside the header 16 is about 7 mm. The depth or height H1 of the header 16 is about 5 mm. The height H2 of the portion forming the abutting-surface 32 of the cap 6 is about 0.1 mm to 0.2 mm.

The surface-roughness of both the abutting-surfaces 32 and 37, wherein quartz surfaces abut directly on each other, is about Ra 1.6. The surface-roughness of the other parts need not be so accurately determined. Of course, these dimensions and degrees are shown only as examples and they should not be taken to limit the scope of the invention.

The operation of the above processing unit will be described below. First, the wafer-boat 8 holds the semiconductor wafers W to be processed in a number of stages at regular pitches in the unloaded condition wherein the elevating mechanism 30 is lowered. Second, the elevating mechanism 30 is driven to move up to gradually raise the cap 6, so that the wafer-boat 8 holding multiple wafers W is loaded into the processing chamber 2 through the opening 18. Next, the opening 18 is closed with the cap 6, so that the processing chamber 2 is tightly sealed.

The loaded wafers W are brought to an appropriate processing temperature by the heater 20. When an oxidation process is to be carried out, for example, a processing gas, which may comprise a corrosive gas such as hydrochloric acid (HCl) gas and oxygen ($O_2$) gas or water vapor, is then supplied into the processing chamber 2 through the gas introducing nozzle 24a and an appropriate process (for example, an oxidation process) starts. The processing gas in the processing chamber 2 is discharged from the discharge port 26 while the processing chamber 2 is maintained at an appropriate processing pressure, for example an atmospheric pressure.

At the same time, as shown in FIG. 3, in order to prevent leakage of the processing gas in the processing chamber 2, an inert gas, for example $N_2$ gas is introduced into the processing chamber 2 through the gas supply passageway 38.

More particularly, the $N_2$ gas introduced through the passageway 38 flows into the header 16, flows around the processing chamber 2 along the header 16, and flows toward the bottom of the processing chamber 2 through the annular ejection opening 36.

Thus the annular ejection opening 36, which is a passageway for introducing the $N_2$ gas into the processing chamber 2, actively causes all the amount of $N_2$ gas to flow into the interior of the processing chamber 2. Therefore, no $N_2$ gas flows out of the processing chamber 2 through the interface between the abutting-surface 37 of the flange 4 and the abutting-surface 32 of the cap 6, so that no processing gas in the processing chamber 2 leaks out together with the $N_2$ gas.

Here, the pressure of the supplied $N_2$ gas is about 1.5 $kg/cm^2$, the amount of the $N_2$ gas flowing into the processing chamber 2 is about 500 to 700 sccm.

The height of the ejection opening 36 is very small in practice although it is shown larger than it is in the drawings. It is about 0.1 mm to 0.2 mm, and about the same as the height H2 of the portion forming the abutting-surface 32. Thus, the amount of the inert gas ejected through the ejection opening 36 is very small as described above. In this case, the amount of the supplied $N_2$ gas is about 1 liter/minute. That is considerably smaller than conventional one, which is about 3 liter/minute.

As described above, owing to the active leaking of the $N_2$ gas in to the interior of the processing chamber 2 through the ejection opening 36, the corrosive gas as a processing gas in the processing chamber 2 does not leak out, so that corrosion or rusting of the equipment around the processing chamber 2 is prevented.

According to the invention, only the annular abutting-surfaces 32 and 37 should be finished to a high degree of surface-roughness by raising the machining precision. The area to be finished is smaller than the conventional one, whereby, the surface-machining of the invention can be much facilitated.

The results of the estimation of this unit are as follows. The kinds of the estimation were a leakage-check (this leakage is the outside one of the processing chamber 2) using litmus papers and the like, an examination of changes in the amount of particles on the wafers before and after a film forming, and an examination of uniformity of the thickness of an oxidation film formed by a Film forming process. They were conducted on 170 8-inch wafers held by a wafer-boat at a 5.2 mm pitch. The number of the test-run was 10, which were under the condition shown in table 1.

TABLE 1

| temperature | type of gas | processing pressure | number of runs |
|---|---|---|---|
| 900° C. | DRY-HCl (3%) | −5 mmH$_2$O (discharging pressure) | ×3 |
| 900° C. | DRY-HCl (3%) | −5 mmH$_2$O (discharging pressure) | ×2 |
| 750° C. | WET-HCl (10%) | −5 mmH$_2$O (discharging pressure) | ×3 |
| 850° C. | WET-HCl (1%) | −5 mmH$_2$O (discharging pressure) | ×1 |
| 800° C. | WET-HCl (1%) | −5 mmH$_2$O (discharging pressure | ×1 |

In Table 1, DRY indicates the supply of $O_2$ gas and WET indicates the supply of water vapor ($H_2O$ gas). Each processing gas contains an appropriate ratio of HCl. Each processing pressure is shown by gauge pressure, that is, a differential pressure between each discharge pressure and the atmospheric pressure.

The HCl leakage-check (this leakage is the outside one of the processing chamber 2) was conducted by the human sense of smell, by the litmus papers attached at the abutting-surfaces of the chamber 2 and the cap 6 and by a HCl detector. The results are shown in FIG. 7.

As shown in FIG. 7, no odor was detected by the human sense of smell, no change was detected by the litmus papers and 0.00 ppm was detected by the HCl detector, for all the 10 runs respectively. The results were satisfactory.

Figure 8:
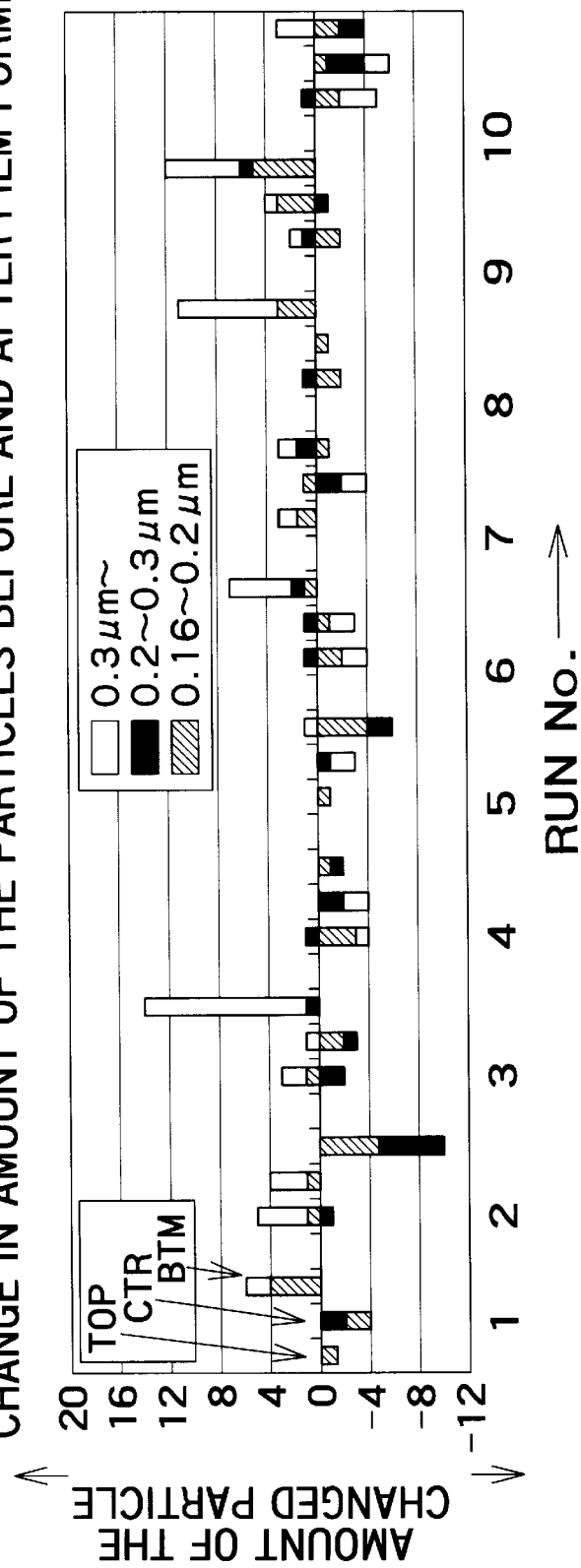
FIG. 8 is a graph of the amount of particles changed by film forming.

Change in the amount of particles on wafers before and after the film forming was examined for three ranges of the particle diameter. The results are shown in FIG. 8. In FIG. 8, TOP indicates wafers in the upper part of the wafer-boat, CTR indicates wafers in the middle part and BTM indicates wafers in the lower part. Increase in the amount of particles after the film forming is shown above the 0 level. Decrease in the amount of particles after the film forming is shown below the 0 level.

The results show that changes in the amount of particles after the film forming is very small and smaller than the allowable amount.

The uniformity in the thickness of the oxide film was examined. The results are shown in FIG. 9. In FIG. 9, WinW indicates the evenness of the film thickness about measuring points of each monitoring wafer. WtoW indicates the evenness of the film thicknesses, that is, the average film thickness of seven monitoring wafers placed apart for each run. OVERALL indicates the evenness of the film thicknesses at all measuring points on the wafers used for each run. RtoR indicates the evenness of the film thickness of all measuring points on the wafers for each recipe.

The results show that the maximum value was 4.19%, so that all the values were within the allowable level. The results were satisfactory. It is very advantageous to be able to maintain the high uniformity of the film thicknesses of the oxide film although $N_2$ gas is actively leaked into the interior of the processing chamber 2.

Figure 10:
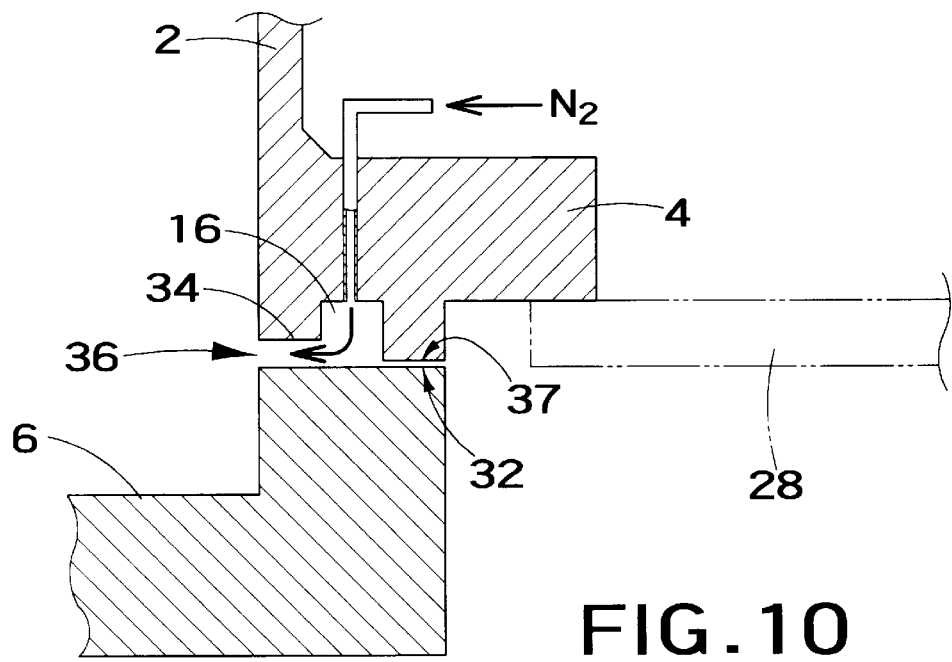
FIG. 10 is a schematic view of the vertical processing unit according to another embodiment of the invention.
Figure 11:
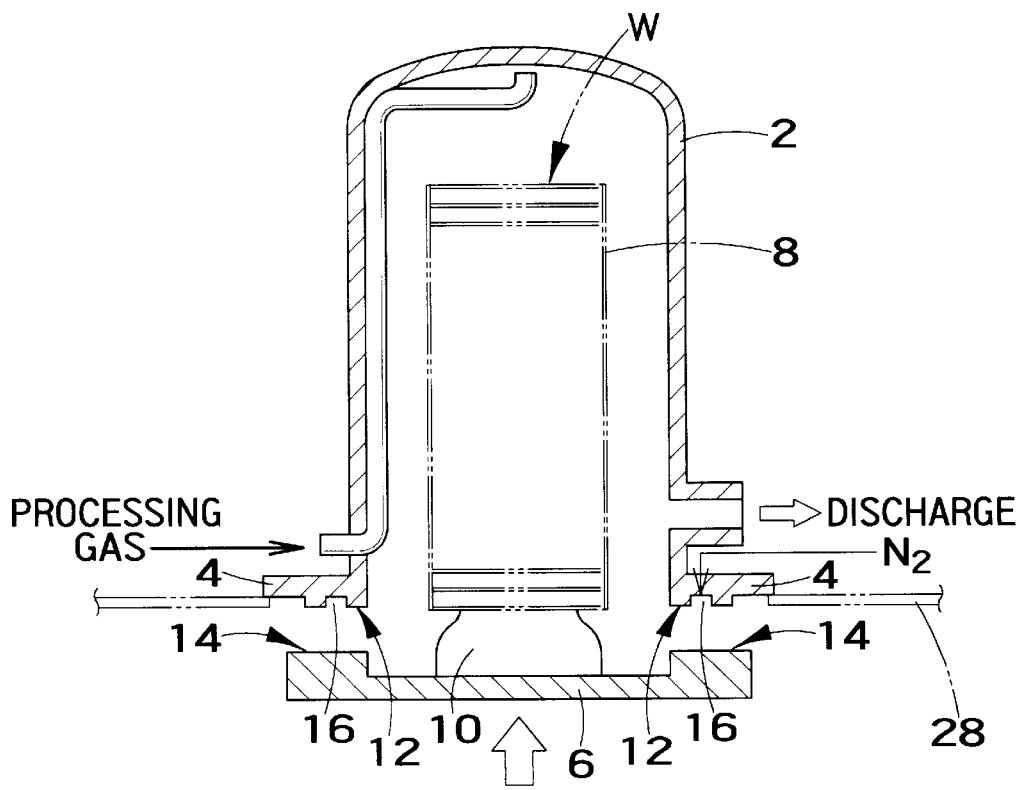
FIG. 11 is a schematic view of a conventional vertical processing unit.
Figure 12:
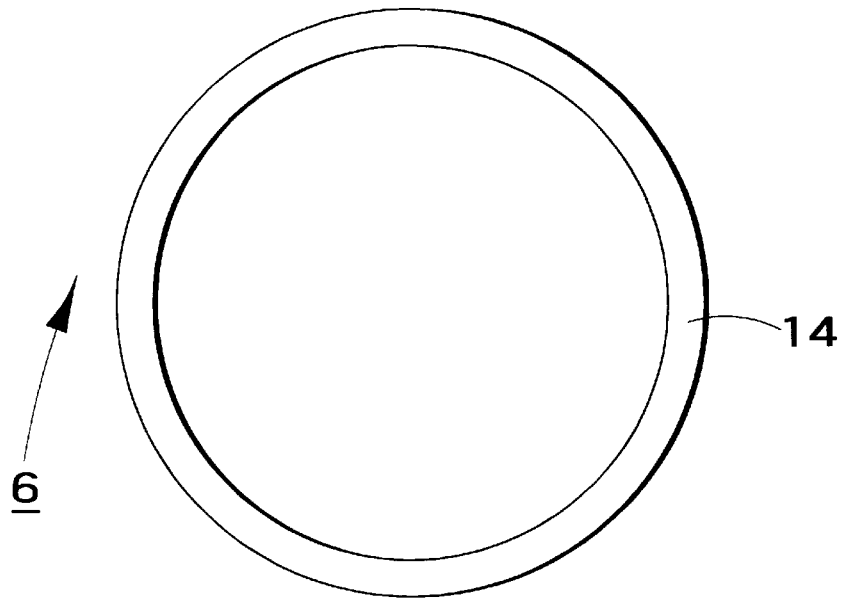
FIG. 12 is a plan view of the cap in FIG. 11.
Figure 13:
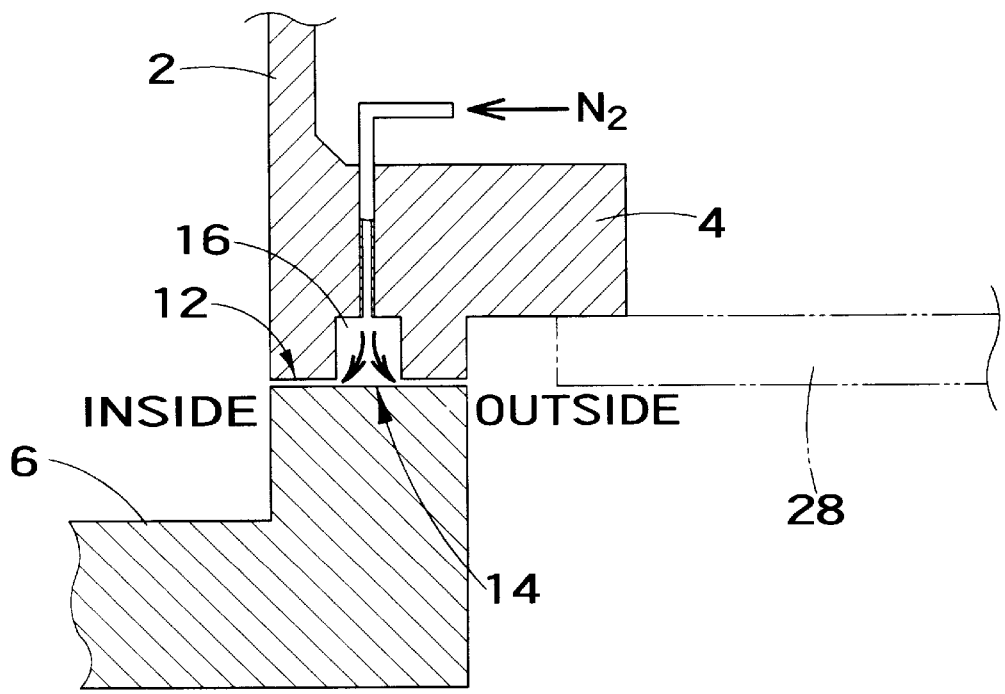
FIG. 13 is an enlarged view of the sealing structure between the processing chamber and the cap in FIG. 11.

As shown in FIG. 3, in this embodiment, the ejection opening 36 is formed by the lowered step 34, which is formed by removing the upper surface of the cap 6. The ejection opening 36 could however be formed in any other manner. For example, as shown in FIG. 10, the peripheral upper surface of the cap 6 may remain planar without removing a portion thereof, and, instead, the lower surface of the flange 4 of the processing chamber 2 may be removed to form a step 34 (an annular groove), which forms the ejection opening 36.

The semiconductor wafers are 8 inch wafers in the above description, but of course could be 12 inch wafers.

The vertical processing unit is a single pipe structure in the above description, but of course could be a double pipe structure.

The ejection opening is annularly continuous in the above description, but plural ejection openings could be formed at intervals, particularly at regular intervals. If the ejection openings are formed at intervals, plural inert gas supply passageways are preferably arranged at positions corresponding to the ejection openings so as to evenly supply the $N_2$ gas into the header.

The inert gas is $N_2$ gas, but could be argon (Ar) gas or helium (He) gas. The semiconductor wafers may be replaced with LCD substrates or glass substrates.

This embodiment of the vertical processing unit brings about good effects as follows.

The processing gas in the processing chamber, which may be a corrosive gas, is surely prevented from leaking out to the outside of the processing chamber by actively leaking an inert gas into the interior of the processing chamber through an ejection opening at the interface of the abutting-surfaces between the processing chamber and the cap.

The abutting-surfaces are easy to machine because the area that should be machined with high degree of precision is small because the abutting area between the flange and the cap is small owing to the ejection opening.

The inert gas is uniformly supplied from the peripheral bottom of the processing chamber particularly when the ejection opening is annular.

What is claimed is:

1. A vertical processing unit comprising:
   a cylindrical processing chamber having an opening formed at a bottom portion thereof and an annular bottom surface formed at a periphery of the opening;
   a disk-shaped cap having an annular abutting-surface abutting on the annular bottom surface of the chamber and a mounting-surface formed on an inside of the annular abutting-surface, said disk-shaped cap being adapted to close the opening of the cylindrical processing chamber; and
   holder for holding an object to be processed, mounted on the mounting-surface of the cap, wherein:
      said abutting-surface has an annular groove formed therein;
      an inert gas supply passageway is provided in communication with the annular groove for supplying an inert gas into a gap between the cylindrical processing chamber and the disk-shaped cap through the annular groove; and
      an ejection opening for ejecting an inert gas toward an inside of the cylindrical process chamber is provided on an inner side of the annular groove for communicating the annular groove and an interior of the processing chamber.

2. A vertical processing unit according to claim 1, wherein:
   the ejection opening is provided annularly along an the inner side of the annular groove in the abutting-surface of the cap.

3. A vertical processing unit according to claim 2, wherein:
   the ejection opening is formed by removing a portion of the cap along the inner side of the annular groove.

4. A vertical processing unit according to claim 1, wherein:
   plural ejection openings are formed at intervals in the inner side of the annular groove.

5. A vertical processing unit according to claim 4, wherein:
   plural ejection openings are formed at regular intervals in the inner side of the annular groove.

6. A vertical processing unit according to claim 4, further comprising:
   plural inert gas supplying passageways arranged at positions corresponding to the plural ejection openings.

7. A vertical processing unit, according to claim 1, wherein:
   the processing chamber is for an oxidation process or a diffusion process conducted on the object to be processed.

8. A vertical processing unit according to claim 1, wherein:
   the processing chamber is made of quartz.

9. A vertical processing unit according to claim 1, wherein:
   the cap is made of quartz.

10. A vertical processing unit comprising;
   a processing cylindrical chamber having an opening formed at a bottom portion thereof and an annular bottom surface formed at a periphery of the opening;
   a disk-shaped cap having an annular abutting-surface corresponding to the annular bottom surface of the chamber and a mounting surface formed on an inside of the annular abutting-surface, said disk-shaped cap being adapted to close the opening of the cylindrical processing chamber; and
   holder for holding an object to be processed, mounted on the mounting surface of the cap, wherein:
      said annular bottom surface has an annular groove formed therein;

an inert gas supplying passageway is provided in communication with the annular groove for supplying an inert gas into a gap between the cylindrical processing chamber and the disk-shaped cap through the annular groove; and an ejection opening for ejecting an inert gas toward an inside of the cylindrical processing chamber is provided on an inner side of the annular groove for communicating the annular groove and an inside of the processing chamber.

11. A vertical processing unit according to claim 10, wherein:

the ejection opening is formed annularly along the inner side of the annular bottom surface of the processing chamber.

12. A vertical processing unit according to claim 11, wherein:

the ejection opening is formed by removing a potion of the inner side of the annular bottom surface of the processing chamber.

13. A vertical processing unit according to claim 10, wherein:

plural ejection openings are formed at intervals in the annular bottom surface of the processing chamber.

14. A vertical processing unit according to claim 13, wherein:

plural ejection openings are formed at regular intervals in the annular bottom surface of the processing chamber.

15. A vertical processing unit according to claim 13, further comprising:

plural inert gas supplying passageways arranged at positions corresponding to the plural ejection openings.

16. A vertical processing unit according to claim 10, wherein:

the processing chamber is for an oxidation process or a diffusion process conducted on the object to be processed.

17. A vertical processing unit according to claim 10, wherein:

the processing chamber is made of quartz.

18. A vertical processing unit according to claim 10, wherein:

the cap is made of quartz.

* * * * *